(12) United States Patent
Wang et al.

(10) Patent No.: US 9,837,267 B2
(45) Date of Patent: Dec. 5, 2017

(54) OPTICAL FILTERING FOR INTEGRATED DIELECTRICS UV CURING PROCESSES

(71) Applicant: Taiwan Semiconductor Manufacturing Company, Ltd., Hsin-Chu (TW)

(72) Inventors: Kuan-Cheng Wang, Toufen Township (TW); Han-Ti Hsiaw, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/143,178

(22) Filed: Apr. 29, 2016

(65) Prior Publication Data

US 2017/0316936 A1   Nov. 2, 2017

(51) Int. Cl.
*H01L 21/31*     (2006.01)
*H01L 21/469*    (2006.01)
*H01L 21/02*     (2006.01)
*C23C 16/56*     (2006.01)

(52) U.S. Cl.
CPC ........ *H01L 21/02348* (2013.01); *C23C 16/56* (2013.01); *H01L 21/02164* (2013.01); *H01L 21/02271* (2013.01)

(58) Field of Classification Search
None
See application file for complete search history.

(56) References Cited

U.S. PATENT DOCUMENTS

2009/0270007 A1* 10/2009 Seok ............... G02F 1/1339
                                                          445/25
2012/0308735 A1* 12/2012 Dimitrakopoulos H01L 21/02126
                                                         427/509

OTHER PUBLICATIONS

Abrisa Technologies, "High Performance Thin Film Optical Coatings Technical Capabilities," ZC&R Coatings for Optics, Sep. 2013, 32 pages.

* cited by examiner

*Primary Examiner* — Calvin Choi
(74) *Attorney, Agent, or Firm* — Slater Matsil, LLP

(57) ABSTRACT

A method of forming a semiconductor device includes forming a dielectric layer over a substrate, and curing the dielectric layer with a first curing process. The first curing process includes providing a first UV light source, filtering the first UV light source with a first filter, the first filter permitting a first electromagnetic radiation within a first pre-determined spectrum to pass through and blocking electromagnetic radiation outside the first pre-determined spectrum, and curing the dielectric layer with the first electromagnetic radiation of the first UV light source.

20 Claims, 8 Drawing Sheets

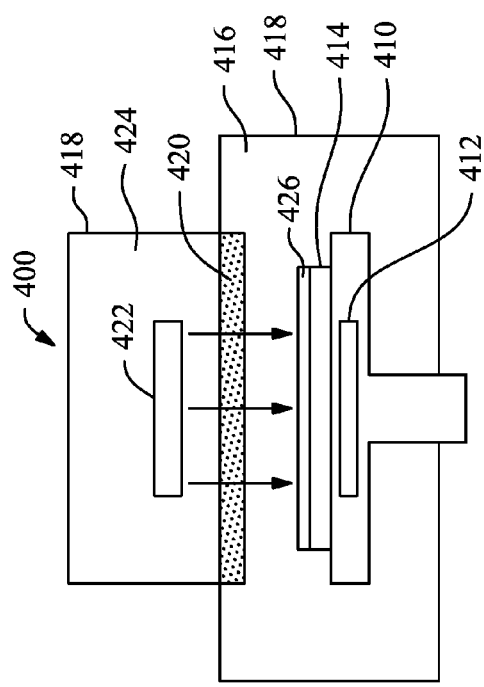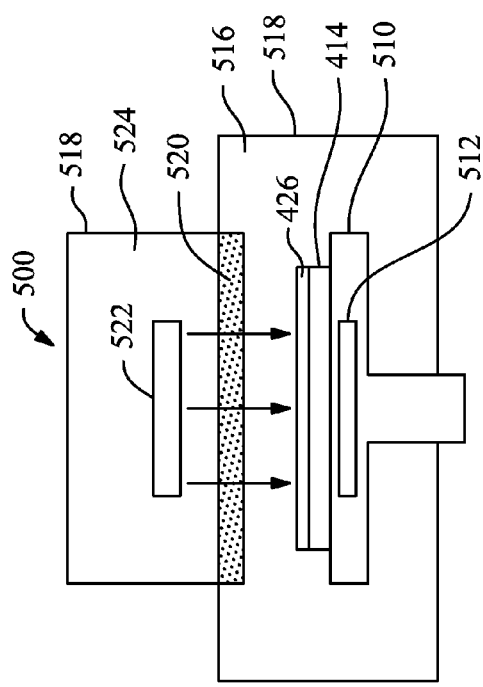

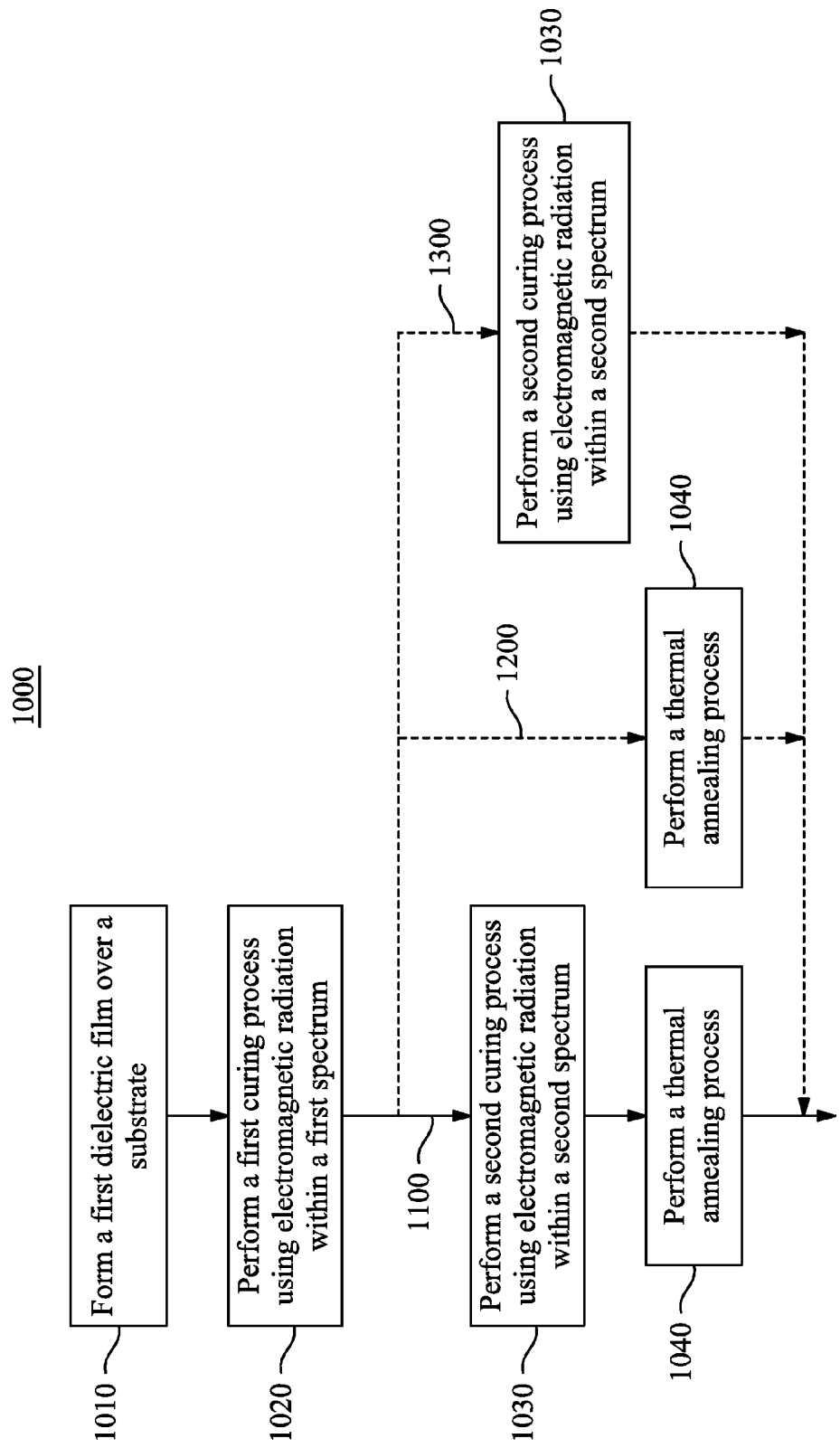

OPTICAL FILTERING FOR INTEGRATED DIELECTRICS UV CURING PROCESSES

BACKGROUND

Dielectric materials, or dielectrics, are widely used in semiconductor fabrication processes. Dielectrics may be used for isolating active areas of the wafer from inactive areas, or to isolate conductive features (e.g., conductive lines and vias) located in the same or different layers of a semiconductor device. For example, in the front-end-of-line (FEOL) processing, dielectrics such as silicon oxide, silicon nitride, silicon oxynitride, or the like, are used to form shallow trench isolation (STI) regions to separate and isolate active areas on a semiconductor wafer from each other. As another example, in the back-end-of-line (BEOL) processing, dielectrics are used to form Inter-Layer Dielectric (ILD) layers over a semiconductor substrate and fill the space between the gate stacks of transistors in integrated circuit (IC) devices. Dielectrics are also used to form Inter-Metal Dielectric (IMD) layers over the ILD layers. IMD layers may be formed of a low-k dielectric material having a dielectric constant (k-value) lower than about 3.0, about 2.5, or even lower.

Chemical vapor deposition (CVD) is widely used for forming dielectrics in IC devices and includes many different variations such as Plasma Enhanced Chemical Vapor Deposition (PECVD), Low Pressure Chemical Vapor Deposition (LPCVD), and Flowable Chemical Vapor Deposition (FCVD). In a typical CVD process, precursors are introduced in a processing region, such as a processing chamber. Chemical reactions happen between the precursors and dielectrics are formed over a workpiece (e.g., a substrate). After the dielectrics is formed, a curing process, such as a Ultra-Violet (UV) curing process, may be performed to cure the dielectrics to enhance its chemical and/or physical properties, e.g., to increase its hardness and/or lower its dielectric constant (k value). Challenges and problems exist in the existing UV curing process. New and improved UV curing processes for fabricating semiconductor devices are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4 and 5 illustrate cross-sectional views of two processing chambers for a multi-step UV curing process in accordance with some embodiments.

FIG. 13 illustrates a flow chart of a method for forming a dielectric film in accordance with some embodiments.

DETAILED DESCRIPTION

Figure 1:
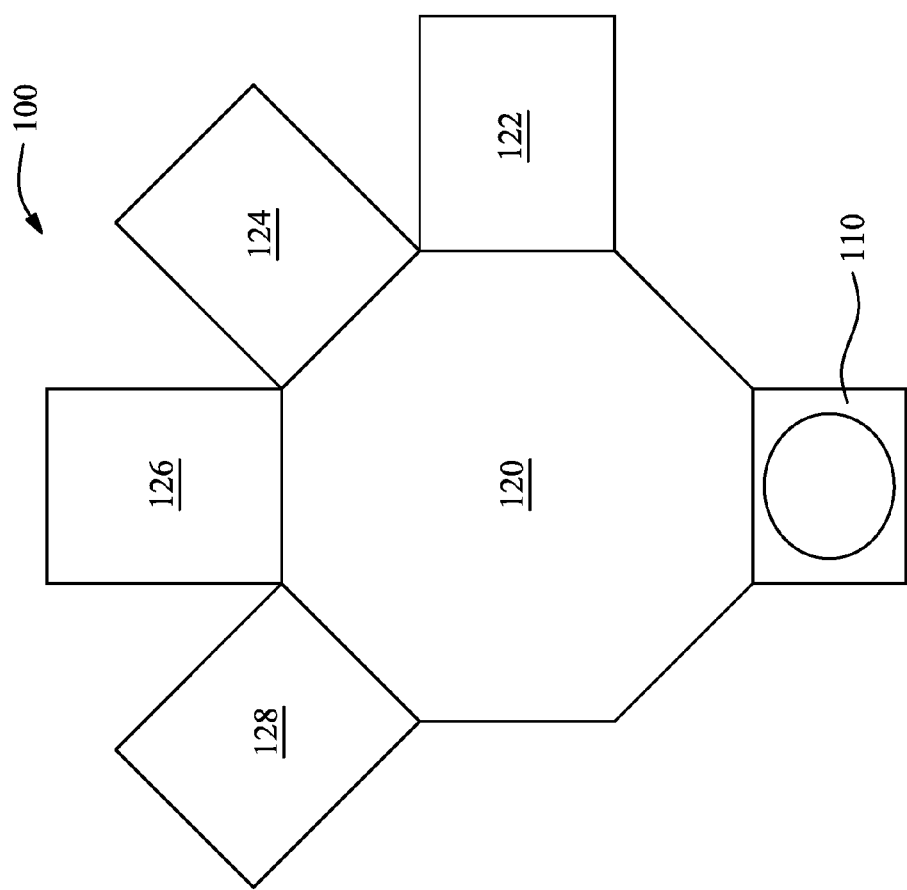
FIG. 1 illustrates an example of a production tool in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various aspects of the present disclosure pertain to methods and apparatuses for forming dielectric layers in a semiconductor device. In particular, methods and apparatuses for UV assisted curing process are disclosed. In some embodiments, a dielectric layer is formed over a substrate and cured by a filtered light within a pre-determined spectrum (e.g., electromagnetic radiation with wavelengths within a certain range). The filtered light may be created by filtering a full-spectrum UV light source (e.g., with wavelengths from about 200 nm to about 1000 nm) with an optical filter which only permits light within the pre-determined spectrum to pass through while preventing light outside the pre-determined spectrum from passing through. In some embodiments, a first curing process is performed using filtered light within a first pre-determined spectrum, followed by a thermal annealing process. In other embodiments, a first curing process is performed using filtered light within a first pre-determined spectrum, followed by a second curing process using filtered light within a second pre-determined spectrum. In yet other embodiments, after a first curing processing and a second curing process, each performed using filtered light within a specific spectrum, a thermal annealing process is performed.

FIG. 1 illustrates an exemplary production tool 100 for forming the embodiments of the present disclosure. Production tool 100 includes a deposition chamber 122 for forming dielectric layers or films, a first processing chamber 124 for UV curing of the dielectric layers, a second processing chamber 126 for further UV curing of the dielectric layers, a third processing chamber 128 for additional processing that might be used in the fabrication of a semiconductor device, and a transfer chamber 120 for transferring wafers between chambers 122, 124, 126 and 128. Production tool 100 further includes a loadlock 110 for loading wafers into, and unloading the wafers from, transfer chamber 120. During the transferring, chambers 120, 122, 124, 126, and 128 stay vacuumed in accordance with some embodiments. Accordingly, the deposition, curing and thermal annealing processes may be performed in production tool 100 with no vacuum break occurring therebetween. Although FIG. 1 shows two processing chambers (e.g., first processing chamber 124 and second processing chamber 126) for UV curing, one or both processing chambers may be used in the fabrication process depending on the design requirements of the semiconductor device. Similarly, the third processing chamber 128 may or may not be used in the fabrication process, and other processing chambers may be added to production tool 100.

Figure 2:
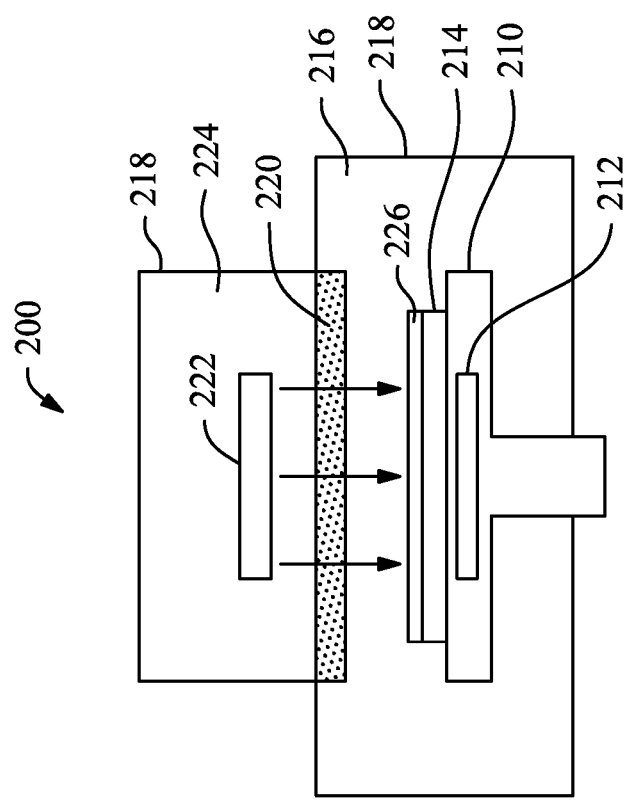
FIG. 2 illustrates a cross-sectional view of a processing chamber for a UV curing process in accordance with some embodiments.
Figure 3:
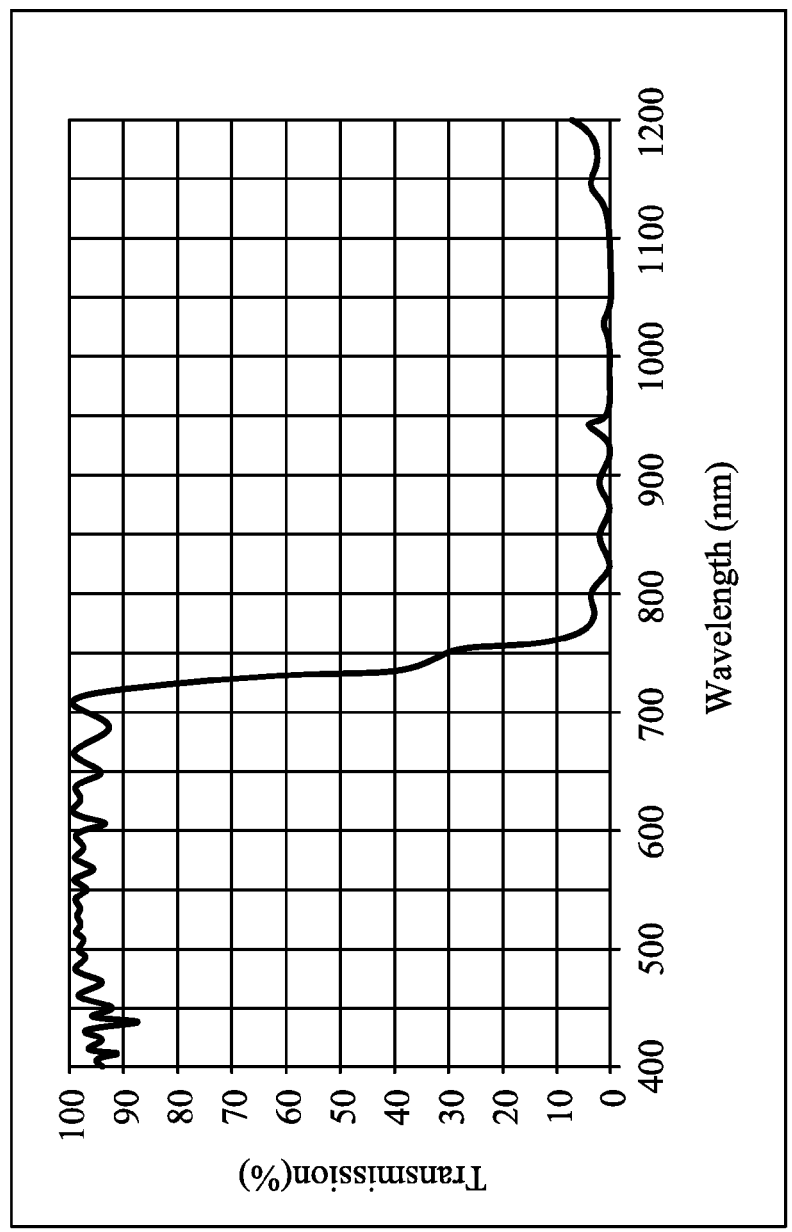
FIG. 3 shows the transmittance characteristics of an optical filter in accordance with some embodiments.

FIGS. 2 and 3 illustrate an embodiment system and method for UV curing of a dielectric film 226 formed over a substrate 214 (sometimes referred to as a wafer 214). In the example of FIGS. 2 and 3, dielectric film 226 is a silicon dioxide layer formed by a Flowable Chemical Vapor Deposition (FCVD) process performed in a deposition chamber, such as deposition chamber 122 of production tool 100 in FIG. 1. As semiconductor process technology advances beyond sub-20 nm node, FCVD has gained importance due to its ability to fill the gap of not only high aspect ratio (e.g., aspect ratios of 8:1 or more) straight vertical trenches, but also the ability to fill small horizontal trenches. FCVD process forms flowable dielectric films which, as their name suggest, can flow to fill voids in a gap. Usually, various chemistries are added to the precursors to allow the deposited film to flow. In some examples, nitrogen hydride bonds are added. After the flowable film is deposited, it may be cured and then annealed to remove the added chemistry to form silicon oxide. Details regarding forming a flowable dielectric film, curing the deposited flowable film, and a subsequent thermal annealing process, are discussed hereinafter.

In accordance with some embodiments, substrate 214 (see FIG. 2) is loaded into a deposition chamber (e.g., deposition chamber 122 of FIG. 1). Substrate 214 may be a semiconductor substrate, such as a bulk semiconductor, a semiconductor-on-insulator (SOI) substrate, or the like, which may be doped (e.g., with a p-type or an n-type dopant) or undoped. Substrate 214 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of substrate 214 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Semiconductor devices, or partially finished semiconductor devices, such as transistors, capacitors, resistors, diodes, or like, may be formed on or in substrate 214.

Next, a first silicon-containing precursor is introduced into the deposition chamber with substrate 214 present. In some embodiments, the silicon-containing precursor is a polysilazane. Polysilazanes are polymers having a basic structure composed of silicon and nitrogen atoms in an alternating sequence. In polysilazanes, each silicon atom is usually bound to two nitrogen atoms, or each nitrogen atom is bound to two silicon atoms, so that these can be described predominantly as molecular chains of the formula $[R_1R_2Si-NR_3]_n$. R1-R3 can be hydrogen atoms or organic substituents. When only hydrogen atoms are present as substituents, the polymers are referred to as perhydropolysilazanes $[H_2Si-NH]_n$. If organic substituents are bound to silicon and/or nitrogen, the compounds are referred to as organopolysilazanes.

In some embodiments, the silicon-containing precursor is a silylamine, such as trisilylamine (TSA), disilylamine (DSA), or a combination thereof. One or more carrier gases may also be included with the silicon-containing precursor. The carrier gases may include helium (He), argon (Ar), nitrogen ($N_2$), the like, or a combination thereof.

Next, a second precursor is provided to the deposition chamber. In some embodiments, the second precursor is a nitrogen-containing precursor. The nitrogen-containing precursor may include $NH_3$, $N_2$, the like, or a combination thereof. In some embodiments, the nitrogen-containing precursor is activated into plasma in a remote plasma system (RPS) outside of the deposition chamber. An oxygen source gas, such as $O_2$ or the like may be included with the nitrogen-containing precursor and activated into plasma in the RPS. Plasma generated in the RPS is carried into the deposition chamber by a carrier gas, which includes He, Ar, $N_2$, the like, or a combination thereof, in some embodiments.

In the deposition chamber, the silicon-containing precursor and the nitrogen-containing precursor mix and react to deposit a film containing silicon and nitrogen on substrate 214. In some embodiments, the deposited film has flowable characteristics. The flowable nature of the formation allows the film to flow into narrow gaps trenches and other structures on the deposition surface of substrate 214.

In an exemplary embodiment of the present disclosure, a dielectric film is formed by an FCVD process with a flow rate of TSA from about 100 standard cubic centimeters per minute (sccm) to about 1000 sccm, a flow rate of $NH_3$ from about 100 to about 1000 sccm, a flow rate of $O_2$ from about 0 sccm to about 500 sccm, and a pressure from about 0 Torr to about 10 Torr. A substrate support on which substrate 214 is positioned maybe be heated to a temperature less than about 100° C. during the FCVD process.

Following the deposition of dielectric film 226 containing silicon and nitrogen on substrate 214, substrate 214 is loaded into a UV curing chamber 200 (e.g., first processing chamber 124 of FIG. 1), and dielectric film 226 is cured in UV curing chamber 200, as illustrated in FIG. 2. In the example of FIG. 2, UV curing chamber 200 is formed by a housing 218 and includes an upper chamber 224 and a lower chamber 216, with a window 220 separating upper chamber 224 from lower chamber 216. In accordance with some embodiments, the lower chamber 216 is configured to be a closed chamber during the curing process (e.g., after loading substrate 214 into UV curing chamber 200). A vacuum mechanism (not shown) may be provided for lower chamber 216, so that a desired level of vacuum can be maintained during the curing process.

As illustrated in FIG. 2, substrate 214 is positioned on the upper surface of a support 210 (sometimes referred to as a chuck 210). Chuck 210 may have a built-in cooling and/or heating mechanism 212 (hereinafter referred to as a wafer temperature conditioning system 212) for cooling or heating substrate 214 during the curing process, depending on the process requirements. For example, wafer temperature conditioning system 212 may direct cool air toward substrate 214 to cool substrate 214, or wafer temperature conditioning system 212 may circulate cold water along built-in channels or pipes within chuck 210 to lower the temperature of substrate 214. As another example, wafer temperature conditioning system 212 may include electrical heating elements to heat substrate 214.

FIG. 2 further illustrates a UV light source 222 provided in upper chamber 224 for the UV curing process. UV light source 222 is a full spectrum UV lamp (e.g., with wavelengths from about 200 nm to about 1000 nm), in some embodiments. Window 220 separates upper chamber 224 from lower chamber 216, and may be made of quartz or any other suitable material that allows passage of electromagnetic radiation of UV light source 222. Housing 218 of UV curing chamber 200, however, is made of material(s) that do not permit passage of the radiation of UV light source 222. In accordance with some embodiments, window 220 has a coating coated over window 220. The coating may be applied on one side of window 220 or on both sides of window 220. Alternatively, the coating material may blend with the material(s) of window 220, thus extending throughout window 220. Therefore, phrases such as "coated over" or "coated on" used herein for describing the coating of window 220 may refer to any of the above options or any other suitable way of applying coating materials on window 220. The coating material may include metal, fluoride compounds, transparent conductors, combinations thereof, or multiple layers thereof. In an exemplary embodiment of the present disclosure, the coating material includes $Ta_2O_5$. The coating material of window 220 permits electromagnetic radiation within a specific spectrum (e.g., electromagnetic radiation with wavelengths within a certain range) to pass through while blocking electromagnetic radiation outside the specific spectrum, in accordance with some embodiments. For example, window 220 with coating coated thereon allows electromagnetic radiation with wavelengths less than about 700 nm to pass through and blocks electromagnetic radiation with wavelengths larger than about 700 nm.

The ability of a coating material to block or let through electromagnetic radiation is characterized by its reflectance and/or transmittance characteristics. Reflectance of a medium is defined by the ratio of reflected radiant power to incident radiant power, while the transmittance of a medium is defined by the ratio of transmitted radiant power to incident radiant power. In some embodiments, window 220 with the coating coated thereon acts as an optical filter, and therefore may be referred to as filter 220 or optical filter 220 hereinafter.

In some embodiments, filter 220 blocks electromagnetic radiation with wavelengths above about 700 nm. Filter 220 allows less than about 5% of the incident radiant power with wavelengths above about 700 nm to go through, in an embodiment of the present disclosure. FIG. 3 illustrates an embodiment transmittance curve of filter 220 used in UV curing chamber 200 of FIG. 2. As illustrated in FIG. 3, electromagnetic radiation with wavelengths below 700 nm passes through filter 220 with very little power loss, as evidenced by the high transmittance of over about 90%. In contrast, electromagnetic radiation with wavelengths above 700 nm is blocked, with only a few percent of incident power passing through filter 220. Since light with wavelengths over 700 nm belongs to the infrared (IR) light spectrum, filters 220 in the example of FIGS. 2 and 3 act as IR filters. One skilled in the art will appreciate that in the context of optical filters, "blocking" and "passing through" refer to the filter's blocking or letting through the majority of incident radiation power, thus "blocking" and "passing through" should not be construed as blocking completely (e.g., 100% blocking) or passing through completely (e.g., 100% passing-through) only.

Figure 6:
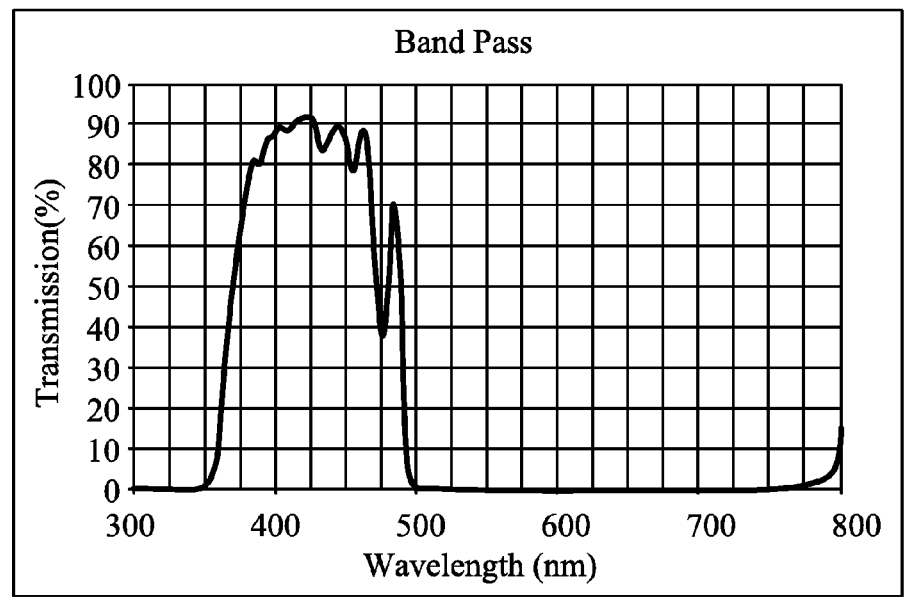
FIG. 6 illustrates the transmittance characteristics of an optical filter in accordance with some embodiments.
Figure 11:
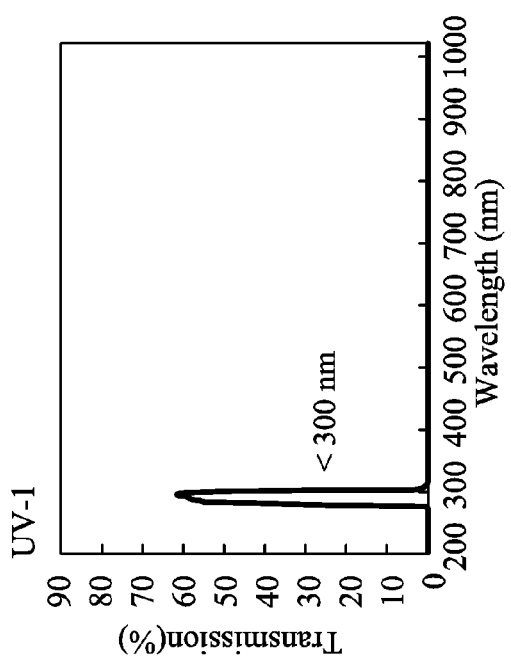

Note that FIGS. 3, 6 and 11 in the present disclosure show the transmittance characteristics of certain optical filters that are described in "High Performance Thin Film Optical Coatings Technical Capabilities (09/13)" by ABRISA Technologies, which is incorporated herein by reference. These and other transmittance/reflectance characteristic curves and the corresponding optical filters disclosed in the present disclosure are simply examples and are not intended to be limiting. Other optical filters with transmittance/reflectance characteristics different from those illustrated in the figures of the present disclosure, are possible and are fully intended to be included within the scope of the present disclosure.

Referring back to FIG. 2, the UV curing process is performed in UV curing chamber 200 for less than about 300 seconds under a pressure between about 0 Torr to about 500 Torr in accordance with some embodiments. As discussed above, filter 220 blocks the IR light and only allows light with wavelengths smaller than about 700 nm to pass through and cure dielectric film 226 on substrate 214. Light with wavelengths smaller than about 700 nm helps to break the Si—N and Si—H bond in dielectric film 226 and promote the formation of Si—Si bond in some embodiments. During the curing process, chuck 210 may cool substrate 214 using, e.g., air cooling or water cooling. In accordance with an embodiment of the present disclosure, the temperature of substrate 214 is below about 25° C. during the curing process.

After the UV curing process, a thermal annealing process is performed, in accordance with some embodiments. The thermal annealing process may be performed in a furnace tool or any other suitable tool for thermal annealing. The thermal annealing process may be performed at temperatures less than about 1000° C. The thermal annealing process may be either a wet or dry anneal, and may be performed for a duration of less than about 5 hours. In some embodiments, the thermal annealing process converts the deposited film 226 containing silicon and nitrogen into a silicon oxide film. In an embodiment, after the thermal annealing process, dielectric film 226 is fully converted into silicon dioxide.

The above process for forming a dielectric film may be advantageously used in the front-end-of-line (FEOL) processing of a semiconductor device fabrication process, e.g., for forming shallow trench isolation (STI) regions in Metal-Oxide-Semiconductor Field-Effect Transistors (MOSFETs), such as Fin Field-Effect Transistors (FinFETs) or other semiconductor devices.

The UV curing process illustrated in FIG. 2 has many advantages. For example, the IR radiation, if left unfiltered, will pass through window 220 and heat substrate 214 during the UV curing process. Heating of substrate 214 may cause silicon loss, due to the outgassing of volatile silicon containing material after UV light breaks up the Si—N and Si—H bonds in dielectric film 226. Silicon loss may reduce the density of the dielectric film and result in poor mechanical properties of the dielectric film and the fabricated semiconductor devices. Silicon loss may also adversely affect (e.g., lower) the resistance of the dielectric film to certain etching process. By blocking the IR light using filter 220, the temperature of substrate 214 could be controlled at a target range (e.g., less than about 25° C.) to avoid silicon loss, thus enhancing the quality of the dielectric film formed and the fabricated semiconductor devices.

FIGS. 4 through 7 illustrate another embodiment system and method for UV curing of a dielectric film. As illustrated in FIGS. 4 and 5, two UV curing chambers, a first UV curing chamber 400 and a second UV curing chamber 500, are used in a multi-step UV curing process. Prior to the multi-step UV curing process shown in FIGS. 4 and 5, a dielectric film 426 is deposited on substrate 414 following similar steps described above for the example shown in FIGS. 2 and 3, using, e.g., a first silicon-containing precursor (e.g., polysilazane) and a second precursor (e.g., NH3 and O2). Details regarding the deposition of the dielectric film are described above and are not repeated herein.

Referring to FIG. 4, substrate 414 with dielectric film 426 deposited thereon is transferred into a first UV curing chamber 400, which chamber might corresponds to first processing chamber 124 of FIG. 1. First UV curing chamber 400 is similar to UV curing chamber 200 in FIG. 2, with labels 4xx in FIG. 4 denoting parts or components that are the same or similar to parts or components labeled as 2xx in FIG. 2. For example, label 410 denotes a chuck in FIG. 4, and label 210 denotes a similar chuck in FIG. 2. The above described labeling convention is used in FIGS. 2, 4, 5, 8, and 9. The coating material for filter 420 (e.g., window 420 with coating) includes metal, fluoride compounds, transparent conductors, combinations thereof, or multiple layers thereof. However, the coating of filter 420 allows electromagnetic radiation within a second spectrum different from a first spectrum of filter 220 to pass through. In accordance with some embodiments, filter 420 selectively permits electromagnetic radiation with wavelengths within a range from about 300 nm to about 600 nm to pass through. Therefore, filter 420 acts as a band pass filter that only allows radiation in the selected spectrum (e.g., between about 300 nm to about 600 nm) to pass through. In some embodiments, transmittance of 95% or higher is achieved by filter 420 for electromagnetic radiation in the selected spectrum (e.g., between about 300 nm to about 600 nm).

In accordance with an embodiment of the present disclosure, the deposited dielectric film 426 is cured in UV curing chamber 400 by a first UV curing process for a duration of less than about 300 seconds and under a pressure from about 0 Torr to about 500 Torr. Chuck 410 may cool substrate 414 to a temperature of less than about 25° C. during the first UV curing process.

FIG. 6 illustrates an embodiment transmittance characteristics curve of filter 420, which shows that radiation with wavelengths outside the selected spectrum are prevented from reaching substrate 414 in lower chamber 416.

In some embodiments, the deposited dielectric film 426 has many Si—N and Si—H bonds. Electromagnetic radiation having wavelengths in the 300-600 nm range helps to break the Si—N and Si—H bonds and creates Si dangling bonds, and helps to transform the Si dangling bonds into Si—Si and Si—O bonds (e.g., through re-bonding). Having more Si—Si and Si—O bonds improves the mechanical property of dielectric film 426, in accordance with some embodiments.

Next, after the first UV curing process, substrate 414 is transferred to second UV curing chamber 500 (which may correspond to second processing chamber 126 of FIG. 1) for a second UV curing process, as illustrated in FIG. 5. UV curing chamber 500 is similar to UV curing chamber 400 in FIG. 4. The coating of filter 520 (e.g., window 520 with coating), however, is different from the coating of filter 420 of UV curing chamber 400. In some embodiments, the coating of filter 520 includes materials such as metal, fluoride compounds, transparent conductors, combinations thereof, or multiple layers thereof. In accordance with some embodiments, filter 520 selectively allows electromagnetic radiation with wavelengths less than about 400 nm to pass through while blocking radiation with wavelengths larger than about 400 nm. Therefore, filter 520 acts as a low pass filter. In an exemplary embodiment of the present disclosure, a gold coating is used for filter 520. In some embodiments, transmittance of 95% or higher is achieved by filter 520 for electromagnetic radiation in the selected spectrum (e.g., less than about 400 nm).

In accordance with an embodiment of the present disclosure, the deposited dielectric film 426 is cured in UV curing chamber 500 by the second UV curing process for a duration of less than about 300 seconds and under a pressure from about 0 Torr to about 500 Torr. Chuck 510 may cool substrate 414 to a temperature of less than about 25° C. during the second UV curing process.

Figure 7:
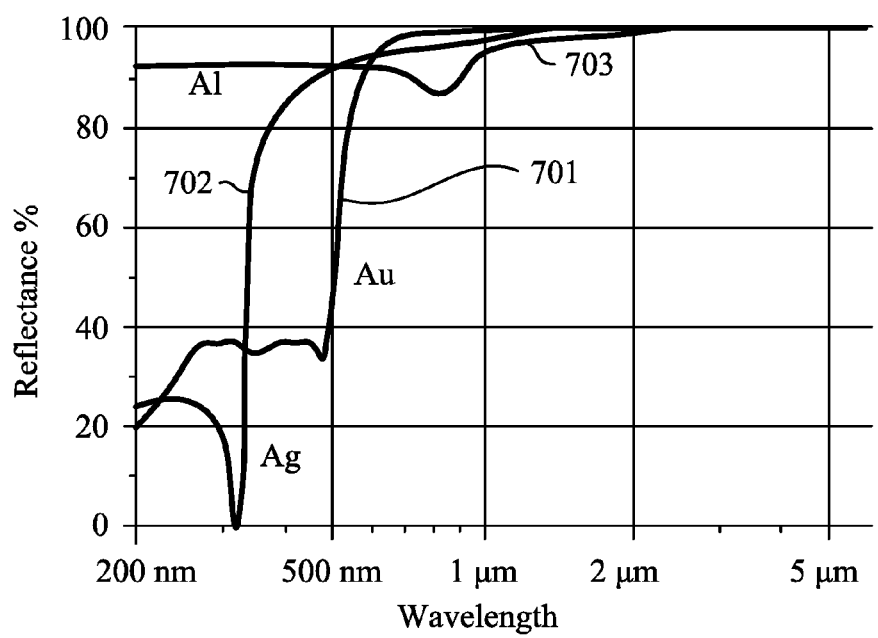
FIG. 7 illustrates the reflectance characteristics for three different coating materials in accordance with some embodiments.

FIG. 7 illustrates the reflectance characteristics of three different coating materials (e.g., Au, Ag and Al). As illustrated in FIG. 7, for a gold coating (curve 701), about 60%~80% of the incident power of electromagnetic radiation with wavelengths less than about 400 nm goes through the gold coating, thus the gold coating offers enough bandwidth as a low pass filter (e.g., filter 520) to let through electromagnetic radiation with wavelengths less than 400 nm. For a silver coating (curve 702), electromagnetic radiation with wavelengths over about 300 nm is mostly blocked, thus the silver coating does not offer as wide a bandwidth as the gold coating. Aluminum coating (curve 703), on the other hand, does not provide enough selectivity between different wavelengths, as evidenced by the small differences between reflectance of different wavelengths (e.g., about 92% reflectance at 300 nm wavelength and 95% reflectance at 1000 nm wavelength).

Electromagnetic radiation with wavelengths less than 400 nm advantageously helps Si—O network crosslinking by, e.g., assisting more Si—O cage to transform into Si—O network. Since Si—O network is stronger than Si—O cage, the mechanical property of the dielectric film is improved by the above UV curing process.

The multi-step UV curing process illustrated in FIGS. 4 and 5 includes two UV curing steps. However, UV curing processes having one curing step or more than two curing steps are also contemplated and are within the scope of the present disclosure. For example, three or more UV curing steps could be used, each with a different optical filter. Furthermore, each UV curing step might be performed for a specific period of time and under a specific curing condition (e.g., pressure, and ambient environment such as gas(es) in the UV chamber). The time and specific curing condition of each UV curing step might, or might not be the same, depending on the design and manufacturing requirements.

After the multi-step UV curing process, a thermal annealing process is performed, in some embodiments. Details of the thermal annealing process are similar to those describe above for the example shown in FIGS. 2 and 3 and are not repeated herein.

Advantages of the multi-step UV curing process illustrated in FIGS. 4 through 7 include lower substrate temperature during curing and better mechanical properties. Since both filter 420 and filter 520 block IR radiation (e.g., wavelengths above 700 nm), substrate 414 is not heated by IR radiation during the curing process. In addition, chucks 410 and 510 further cool down substrate 414 during the curing process. The resulting lower substrate temperature helps to reduce or prevent silicon loss due to outgassing, thus improving the mechanical property of the dielectric film. Furthermore, each of filters 420 and 520 only allows radiation within a specific spectrum to pass through, and each specific spectrum can be selected to achieve specific purpose(s), thus optimizing the results of the curing process. For example, the spectrum of 300-600 nm helps the formation of more Si dangling bonds and the transformation of Si dangling bonds to Si—Si and Si—O bonds, whereas the spectrum of less than 400 nm further helps Si—O network crosslinking. The ability to choose a specific spectrum for curing enables process engineers to easily design multi-step UV curing procedures to satisfy different performance requirements in each curing step, thus achieving optimum performance, which optimum performance may not be possible with a full-spectrum UV light source.

FIGS. 8 through 12 illustrate an embodiment system and method for forming a low-k dielectric film. In an exemplary embodiment, the low-k dielectric film is porous low-k dielectric film, such as a SiCOH film. The porous low-k dielectric film may be used for, as an example, inter-metal dielectrics (IMD) or inter-layer dielectrics (ILD) in the back-end-of-line (BEOL) processing of an integrated circuit. The low-k dielectric film SiCOH may be formed by, e.g., a CVD or a PECVD process. Porogens, which are sacrificial "pore generating" materials that are compatible with the dielectric materials, are added to the film during the layer formation or afterwards. A curing step is then used to decompose and remove portions of the porogen material out of the film layer, causing pores. The pores lower the dielectric constant of the now porous low-k SiCOH film still further, thus improving performance of the SiCOH material as a low-k dielectric. The k constant can be lowered to <2.7 and can be made between 2.0-2.7, for example. Details regarding an embodiment PECVD process and a multi-step UV curing process for forming a porous low-k dielectric film are discussed below with reference to FIGS. 8 through 12.

In accordance with some embodiments, a first precursor is introduced into a deposition chamber (e.g., deposition chamber 122 of FIG. 1) with substrate 814 (see FIG. 8) present. Substrate 814 is similar to substrate 214 of FIG. 2 and the description is not repeated herein. The first precursor may include diethoxymethylsilane (DEMS) ($SiHCH_3(OC_2H_5)_2$), tetra methyl cyclo tetra siloxanes (TMCTS), the like, or combinations thereof. DEMS and TMCTS both are precursors used in the semiconductor industry for Plasma Enhanced Chemical Vapor Deposition (PECVD) of SiOCH films as a low-k dielectrics in advanced semiconductor devices. A second precursor containing a porogen is also introduced into the deposition chamber, in some embodiments. Porogen, such as alpha-terpinene (ATRP) ($C_{10}H_{16}$), is used as the second precursor, although other suitable porogen may also be used. Carrier gases, such as He, Ar, or the like may be used to carry the first precursor and/or the second precursor into the deposition chamber. In accordance with some embodiments, the first precursor and the second precursor are activated in the deposition chamber into plasmas, and the plasmas react with each other and form a low-k dielectric film 826 (see FIG. 8) over substrate 814. In accordance with some embodiments, a low-k dielectric film is formed by a PECVD process with a flow rate of DEMS from about 100 sccm to about 2000 sccm, a flow rate of ATRP from about 1000 sccm to about 3000 sccm, a flow rate of $O_2$ from about 100 sccm to about 2000 sccm, and a pressure from about 0 Torr to about 50 Torr. A substrate support on which substrate 814 is positioned may be heated to a temperature of less than 400° C.

Figure 8:
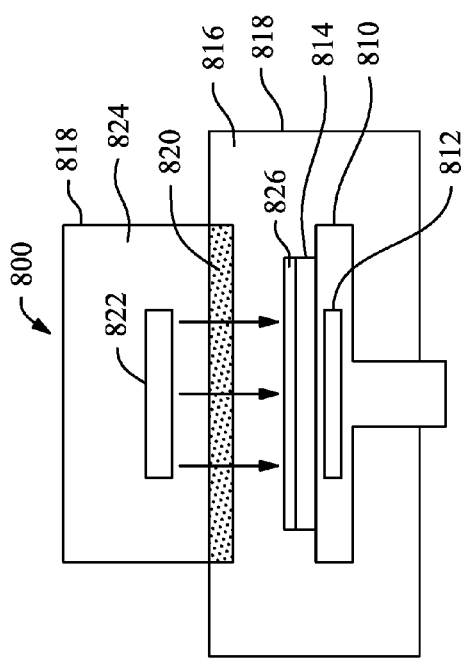
FIGS. 8 and 9 illustrate cross-sectional views of two processing chambers for another multi-step UV curing process in accordance with some embodiments.
Figure 10:
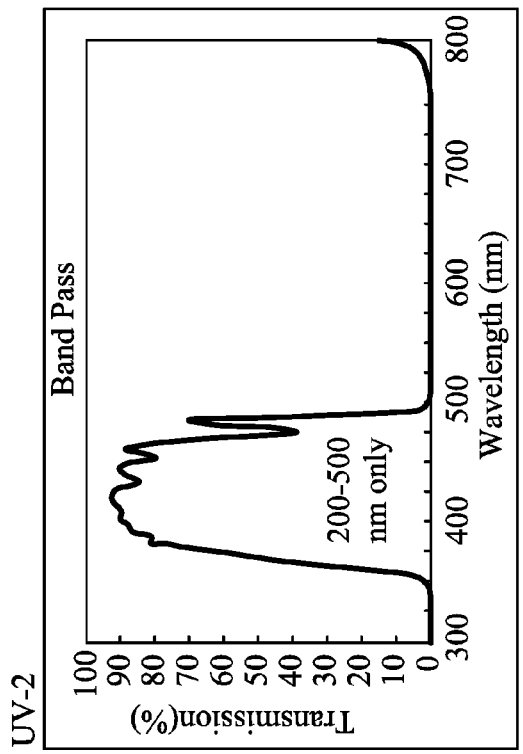
FIGS. 10 and 11 illustrate the transmittance characteristics of two optical filters, in accordance with some embodiments.

Next, substrate 814 with low-k dielectric film 826 deposited thereon is transferred to a first UV curing chamber 800, and a first UV curing process is performed, as illustrated in FIG. 8. The first UV curing chamber 800 may corresponds to first processing chamber 124 of FIG. 1. UV curing chamber 800 is similar to UV curing chamber 400 in FIG. 4. Filter 820 (e.g., window 820 with coating) of UV curing chamber 800, however, has a coating that is different from the coating of filter 420 of UV curing chamber 400. The coating material of filter 820 includes metal, fluoride compounds, transparent conductors, combinations thereof, or multiple layers thereof. In some embodiments, a silver coating is used for filter 820. Filter 820 of UV chamber 800 selectively permits electromagnetic radiation with wavelengths less than about 300 nm to pass through, in accordance with some embodiments. In some embodiments, transmittance of 50% or higher is achieved by filter 820 for electromagnetic radiation in the selected spectrum (e.g., less than about 300 nm). FIG. 10 illustrates an embodiment transmittance characteristics curve of filter 820.

In accordance with an embodiment of the present disclosure, the deposited low-k dielectric film 826 is cured in UV curing chamber 800 by a first UV curing process for a duration of less than about 60 seconds and under a pressure from about 0 Torr to about 50 Torr. Chuck 810 heats substrate 814 to a temperature of less than about 400° C. during the first UV curing process, in some embodiments.

UV light with wavelengths less than 300 nm is beneficial for removing porogen from the deposited low-k dielectric film. For example, during the PECVD process to deposit the low-k dielectric film, porogen may undergo radical reactions with the Si—H bonds of the SiOCH backbone and form Si-porogen bonds. UV light in the sub-300 nm spectrum could weaken the Si-porogen bonds. Once the Si-porogen bonds are weakened, porogen can removed by, e.g., an outgassing process and pumped out of UV curing chamber 800 by a carrier gas such as $N_2$, Ar, He, the like, or combinations thereof. Pores form when porogen is driven out of the low-k dielectric film, which pores further reduce the dielectric constant of the low-k dielectric film, as discussed above.

Referring back to FIG. 8, during the first UV curing process, chuck 810 may heat substrate 814 using an internal heating element 812, such as an electrical heating element 812. As discussed above, porous low-k dielectric films may be used in the BEOL processing to form ILDs or IMDs, thus the requirements and concerns of the fabrication process may be different from the FEOL process, and heating substrate 814 may be beneficial for the multi-step UV curing process illustrated in FIGS. 8 through 12. For example, heating may help the porogen removal process.

Figure 9:
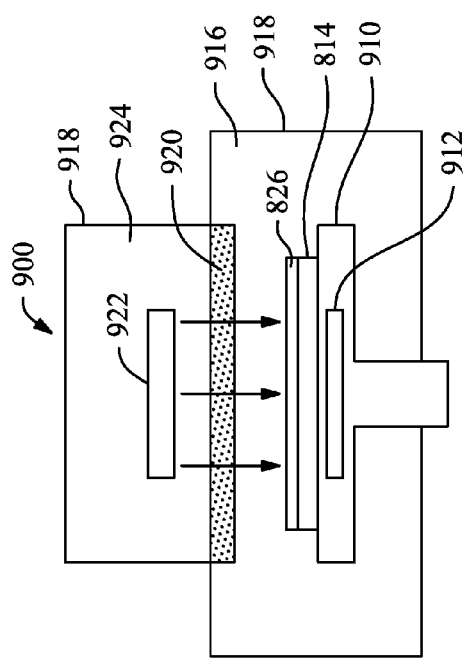

After the first UV curing process, substrate 814 is transferred to a second UV curing chamber 900 (which may correspond to second processing chamber 126 of FIG. 1) for a second UV curing process, as illustrated in FIG. 9. The second UV curing chamber 900 is similar to UV curing chamber 800 in FIG. 8. Filter 920 (e.g., window 920 with coating) of UV curing chamber 900, however, has a different coating from the coating of filter 820 of UV curing chamber 800. The coating material of filter 920 comprises materials such as metal, fluoride compounds, transparent conductors, combinations thereof, or multiple layers thereof. In accordance with some embodiments, filter 920 selectively permits electromagnetic radiation with wavelengths between about 200 nm to about 500 nm to pass through. Electromagnetic radiation in the 200-500 nm spectrum helps to form Si—O and/or Si—OCH$_2$—Si network crosslinking, thus improving the mechanical property of the low-k dielectric film. In some embodiments, transmittance of 95% or higher is achieved by filter 920 for electromagnetic radiation in the selected spectrum (e.g., between about 200 nm to about 500 nm). FIG. 11 illustrates an embodiment transmittance characteristics curve of filter 920.

In accordance with an embodiment of the present disclosure, the deposited low-k dielectric film is cured in the second UV curing chamber 900 by a second UV curing process for a duration of less than about 240 seconds and under a pressure from about 0 Torr to about 50 Torr. Chuck 910 heats substrate 814 to a temperature of less than about 400° C. during the second UV curing process, in some embodiments.

Figure 12:
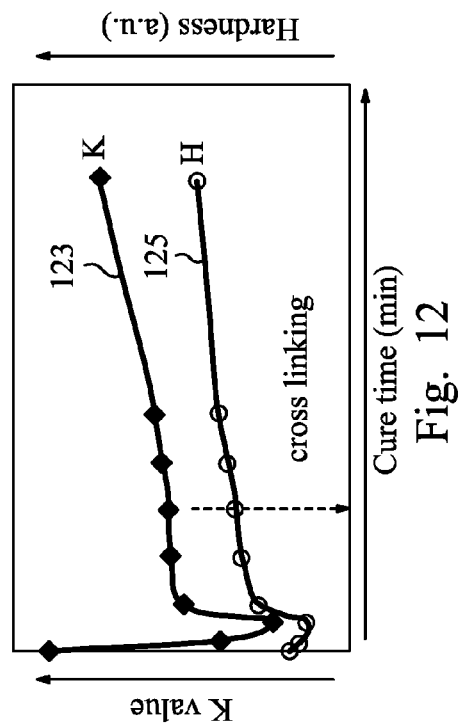
FIG. 12 illustrates the relationship of the k value and the hardness of the dielectric film versus the curing time for the UV curing processes shown in FIGS. 8 and 9, respectively, in accordance with some embodiments.

FIG. 12 illustrates two curves showing the characteristics of the UV curing processes regarding the porogen removal process and the crosslinking process, respectively. Curve 123 shows the k-value of the low-k dielectric film vs. curing time for the first UV curing process (e.g., the porogen removal process), and curve 125 shows the hardness of the low-k dielectric film vs. curing time for the second UV curing process (e.g., the crosslinking process). For example, curve 123 shows a drop in the k-value as curing is performed initially from the beginning, and after the k-value reaches a minimum value, k-value starts to increase as the curing continues. Curve 125 shows an initial drop in the hardness of the low-k dielectric film followed by an increase of the hardness as curing continues. Since each of the first and the second UV curing process is sensitive to electromagnetic radiation within a specific spectrum, the first and the second UV curing process can be performed sequentially using different filters. Each filter (e.g., filters 820 and 920) filters a full-spectrum UV light source and only allows radiation within a specific spectrum to pass through and cure the deposited low-k dielectric film. The ability to choose a different spectrum in each curing process allows each curing step to be optimized for certain performance criteria (e.g., to lower the k-value or to increase the hardness of the film) without the constraint or concern of another performance criteria. This greatly simplifies the design of the curing procedure and allows optimum curing performance to be achieved, which may be not possible with a full-spectrum UV light source, because some performance criteria may have conflicting curing requirements if a full-spectrum UV light source is used.

The curing process illustrated in FIGS. 8 through 12 shows two curing steps. One skilled in the art will appreciate that curing process with one step or more than two steps are also possible and are within the scope of the present disclosure.

FIG. 13 illustrates a flow chart of a method for fabricating a dielectric film, in accordance with some embodiments. It should be understood that the embodiment methods shown in FIG. 13 is an example of many possible embodiment methods. One of ordinary skill in the art would recognize many variations, alternatives, and modifications. For example, various steps as illustrated in FIG. 13 may be added, removed, replaced, rearranged and repeated.

Referring to FIG. 13, at step 1010, a dielectric film is formed over a substrate. At step 1020, a first curing process is performed using a first electromagnetic radiation within a first spectrum (e.g., see FIGS. 2, 4, and 8). At step 1030, a second curing process is performed using a second electromagnetic radiation within a second spectrum (e.g., see FIGS. 5 and 9). At step 1040, a thermal annealing process is performed. The process steps 1030 and 1040 follow a first process path 1100. In an alternative process path 1200, a thermal annealing process in step 1040 is performed after a first curing process in step 1020 (e.g., see FIG. 2) without performing a second curing process in step 1030. In another alternative process path 1300, a second curing process in step 1030 (e.g., see FIG. 9) is performed after the first curing process in step 1020 (e.g., see FIG. 8) without performing a thermal annealing process in step 1040.

Embodiments may achieve advantages. The blocking of IR radiation using a filter prevents the heating of substrate during the curing process. The lower temperature of the substrate helps to prevent or reduce silicon loss, thus improving the mechanical properties of the dielectric film formed. The utilization of the electromagnetic radiation (e.g., UV light source) within a given spectrum enables optimization of the curing process for different performance criteria in each curing step. For examples, radiation within a first spectrum (e.g., less than 300 nm) helps removal of porogen (e.g., lower k value), while radiation within another spectrum (e.g., 200-500 nm) helps forming more Si—Si and Si—O crosslinking, which improves the mechanical properties of the dielectric film formed. The ability to choose different spectrum allows process engineers to design multi-step curing process to optimize for different performance criteria in different curing steps. This flexibility and advantage may not be possible if an unfiltered full-spectrum UV light source is used for curing.

In accordance with some embodiments, a method of forming a semiconductor device includes forming a dielectric layer over a substrate, and curing the dielectric layer with a first curing process. The first curing process includes providing a first UV light source, filtering the first UV light source with a first filter, the first filter permitting a first electromagnetic radiation within a first pre-determined spectrum to pass through and blocking electromagnetic radiation outside the first pre-determined spectrum, and curing the dielectric layer with the first electromagnetic radiation of the first UV light source.

In accordance with other embodiments, a method includes depositing a dielectric layer over a wafer, and performing a first curing process. The first curing process includes filtering a first light source with a first optical filter, the first optical filter allowing light with wavelengths inside a first pre-determined range to pass through while preventing light with wavelengths outside the first pre-determined range from passing through, and treating the dielectric layer with the light passing through the first optical filter. The method further includes performing a second curing process. The second curing process includes filtering a second light source with a second optical filter, the second optical filter allowing light with wavelengths inside a second pre-determined range to pass through while preventing light with wavelengths outside the second pre-determined range from passing through, and treating the dielectric layer with the light passing through the second optical filter.

In accordance with yet other embodiments, a production tool for semiconductor fabrication includes a deposition chamber and a first UV curing chamber having a first window. The first window is configured to allow light within a first pre-determined spectrum to pass through while blocking light outside the first pre-determined spectrum.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a dielectric layer over a substrate;
    curing the dielectric layer with a first curing process, the first curing process comprising:
        providing a first UV light source;
        filtering the first UV light source with a first filter, the first filter permitting a first electromagnetic radiation within a first pre-determined spectrum to pass through and blocking electromagnetic radiation outside the first pre-determined spectrum; and
        curing the dielectric layer with the first electromagnetic radiation of the first UV light source; and
    performing a thermal annealing process after the first curing process.

2. The method of claim 1, wherein the first pre-determined spectrum comprises electromagnetic radiation with wavelengths below about 700 nm.

3. The method of claim 2, wherein the first curing process is performed under a pressure of less than about 500 Torr and for a duration of less than about 300 seconds.

4. The method of claim 1 further comprising, after the first curing process and before the thermal annealing process:
    curing the dielectric layer with a second curing process, the second curing process comprising:
        providing a second UV light source;
        filtering the second UV light source with a second filter, the second filter permitting a second electromagnetic radiation within a second pre-determined spectrum to pass through and blocking electromagnetic radiation outside the second pre-determined spectrum; and
        curing the dielectric layer with the second electromagnetic radiation of the second UV light source.

5. The method of claim 4, wherein the first pre-determined spectrum comprises electromagnetic radiation with wavelengths from about 300 nm to about 600 nm, and the second pre-determined spectrum comprises electromagnetic radiation with wavelengths less than about 400 nm.

6. The method of claim 5, wherein each of the first curing process and the second curing process is performed under a pressure between about 0 Torr to about 500 Torr and for a duration of less than about 300 seconds.

7. The method of claim 4, wherein a temperature of the substrate is less than about 25° C. during the first curing process and the second curing process.

8. The method of claim 1, wherein the thermal annealing process is performed at a temperature of less than about 1000° C. and for a period of less than about 5 hours.

9. A method comprising:
    depositing a dielectric layer over a wafer;
    performing a first curing process, the first curing process comprising:
        filtering a first light source with a first optical filter, the first optical filter allowing light with wavelengths inside a first pre-determined range to pass through while preventing light with wavelengths outside the first pre-determined range from passing through; and
        treating the dielectric layer with the light passing through the first optical filter; and
    performing a second curing process, the second curing process comprising:
        filtering a second light source with a second optical filter, the second optical filter allowing light with wavelengths inside a second pre-determined range to pass through while preventing light with wavelengths outside the second pre-determined range from passing through; and
        treating the dielectric layer with the light passing through the second optical filter.

10. The method of claim 9 further comprising performing a thermal annealing process after the second curing process.

11. The method of claim 10, wherein the first pre-determined range is from about 300 nm to about 600 nm, and the second pre-determined range is less than about 400 nm.

12. The method of claim 9, wherein the first pre-determined range is less than about 300 nm, and the second pre-determined range is from about 200 nm to about 500 nm.

13. The method of claim 1, wherein the substrate is at a temperature below about 25° C. during the first curing process.

14. The method of claim 10, wherein the dielectric layer is at a temperatures below about 25° C. while being treated by the first curing process and the second curing process.

15. The method of claim 11, wherein a first coating material of the first optical filter comprises a material selected from the group consisting essentially of metal, fluoride compounds, transparent conductors, and combinations thereof, and a second coating of the second optical filter comprises gold.

16. The method of claim 12, wherein the first curing process is performed under a pressure of less than about 50 Torr and for a during of less than about 60 seconds, and the second curing process is performed under a pressure of less than about 50 Torr and for a duration of less than about 240 seconds.

17. The method of claim 16, further comprising heating the wafer to a temperature of less than about 400° C. during the first curing process and the second curing process.

18. A method comprising:
    forming a dielectric layer over a substrate;
    curing the dielectric layer at a first temperature using a first curing process, the first curing process comprises:
        filtering a first light source using a first optical filter, the first optical filter permitting a first electromagnetic radiation within a first spectrum to pass; and
        subjecting at least a first portion of the dielectric layer to the first electromagnetic radiation;
    curing the dielectric layer at a second temperature using a second curing process after the first curing process, the second curing process comprises:
        filtering a second light source using a second optical filter, the second optical filter permitting a second electromagnetic radiation within a second spectrum different from the first spectrum to pass; and
        subjecting the at least the first portion of the dielectric layer to the second electromagnetic radiation.

19. The method of claim 18, wherein the first temperature and the second temperature are below about 25° C.

20. The method of claim 18, further comprising performing an anneal process after the second curing process.

* * * * *